United States Patent [19]

Okita

[11] Patent Number: 4,974,045
[45] Date of Patent: Nov. 27, 1990

[54] BI-POLAR TRANSISTOR STRUCTURE

[75] Inventor: Yoshihisa Okita, Tokyo, Japan

[73] Assignee: Oki Electric Industry Co., Inc., Japan

[21] Appl. No.: 318,604

[22] Filed: Mar. 3, 1989

[30] Foreign Application Priority Data

Mar. 10, 1988 [JP] Japan .................................. 63-55023

[51] Int. Cl.⁵ .......................................... H01L 29/72
[52] U.S. Cl. ........................................ 357/34; 357/59
[58] Field of Search ......................... 357/59 H, 34, 54

[56] References Cited

U.S. PATENT DOCUMENTS

| | | | |
|---|---|---|---|
| 3,600,651 | 8/1971 | Duncan | 357/59 |
| 4,425,574 | 1/1984 | Silvestri et al. | 357/59 H |
| 4,663,831 | 5/1987 | Birrittella et al. | 357/59 |
| 4,686,763 | 8/1987 | Thomas et al. | 357/59 H |
| 4,696,097 | 9/1987 | McLaughlin et al. | 357/34 |
| 4,764,801 | 8/1988 | McLaughlin et al. | 357/34 |
| 4,849,371 | 7/1989 | Hansen et al. | 357/34 |
| 4,897,704 | 1/1990 | Sakurai | 357/34 |

OTHER PUBLICATIONS

IEDM 1987; "A Sub-40 PS ESL Circuit at a Switching Current of 1.28 MA", Katsunobu Ueno, Hiroshi Goto; Eiji Sugiyama and Hiroyuki Tsunoi, pp. 371-374.
IEDM 1987; "BSA Technology for Sub-100nm Deep Base Bipolar Transistors", H. Takemura, S. Ohi, M. Sugiyama, T. Tashiro and M. Nakamae, pp. 375-378.

Primary Examiner—William D. Larkins
Assistant Examiner—Mark Prenty
Attorney, Agent, or Firm—Edward D. Manzo

[57] ABSTRACT

A bi-polar transistor structure in a superhigh speed logic integrated circuit, and a process for producing the same are disclosed. The transistor has a substantially coaxial symmetric structure. Single crystal active layers as base and collector regions have peripheries surrounded wholly or partially by respective polycrystalline electrode layers. The polysilicon electrodes have lateral portions and downward depending portions that connect to single crystal layers. The polycrystalline electrode layers are separated from each other by insulation. One process for producing the structure uses only thin film forming techniques and etching techniques to dispose the active layers, an emitter electrode layer, parts of the other electrode layers and parts of the insulating layers inside a recess formed in an insulating layer formed on a substrate. Another process uses a photoetching technique by which polycrystalline layers for base and collector electrodes are patterned. Around the patterned polycrystalline electrode, side wall insulating layers are formed in the respective later steps.

12 Claims, 15 Drawing Sheets

FIG_1(a)
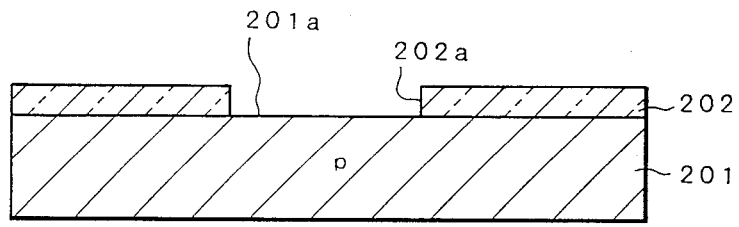
FIG_1(b)
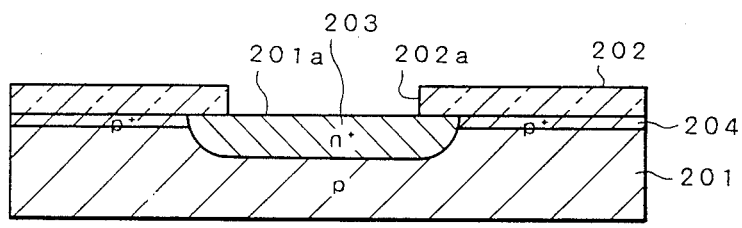
FIG_1(c)
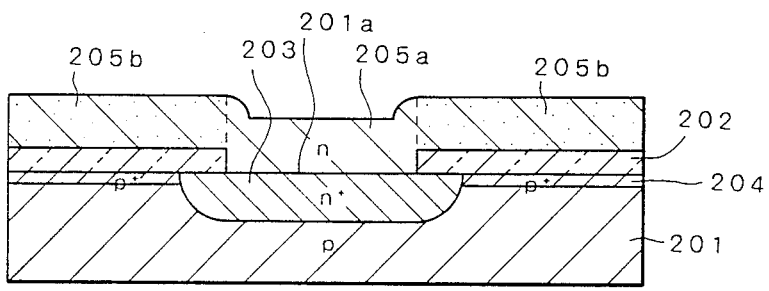

FIG_1(d)
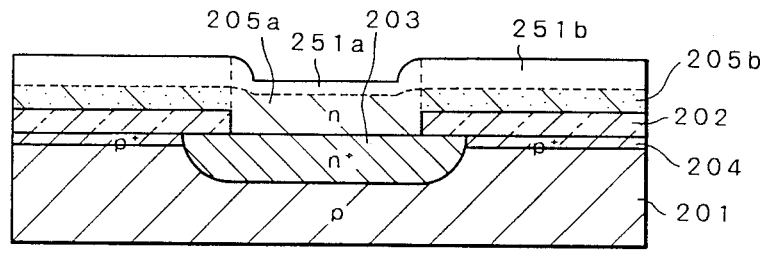
FIG_1(e)
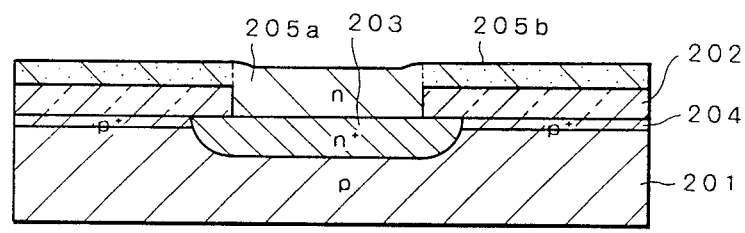
FIG_1(f)
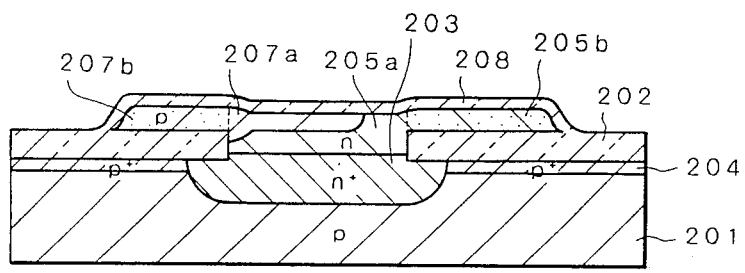

FIG_1(g)
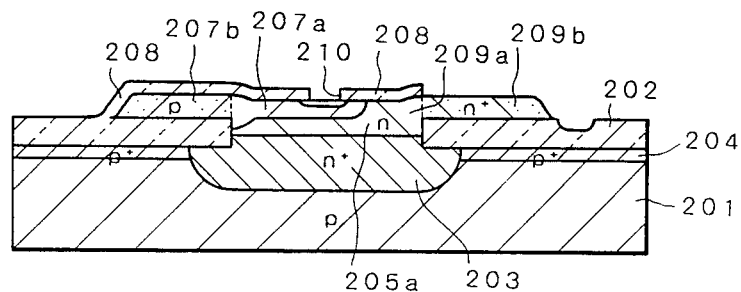
FIG_1(h)
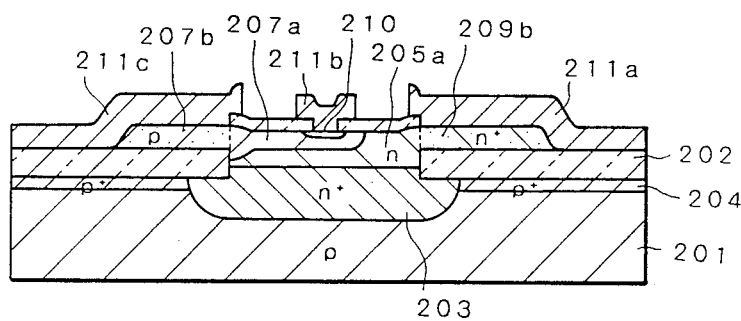

FIG_2(a)
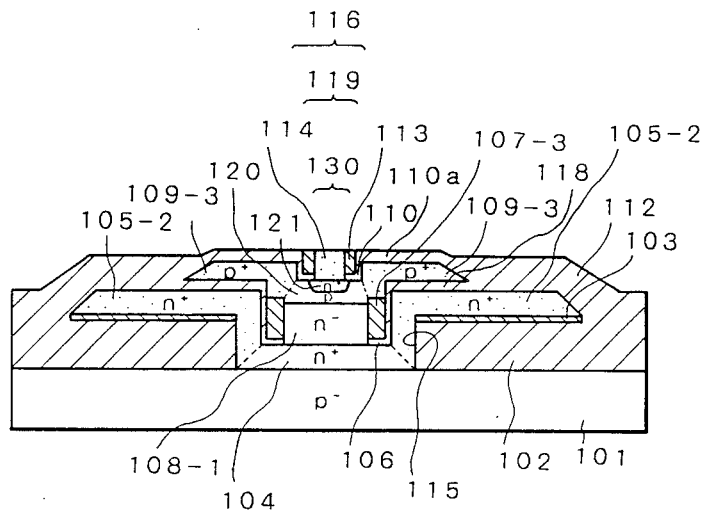
FIG_2(b)
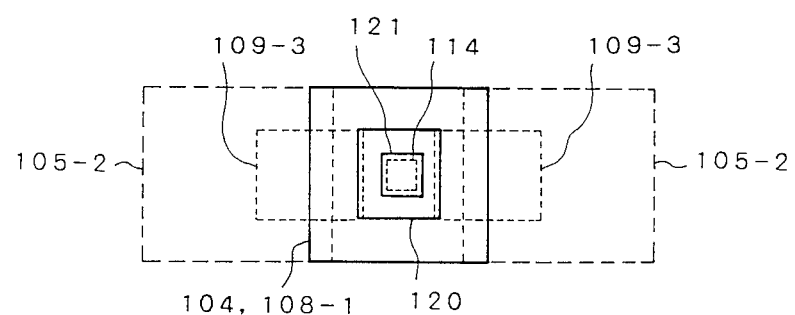

FIG_3(a)
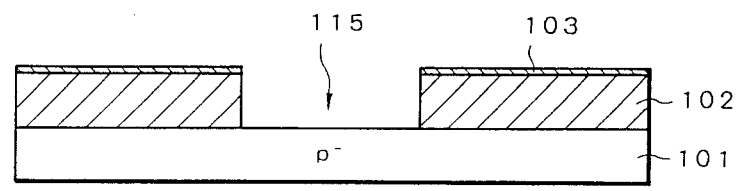
FIG_3(b)
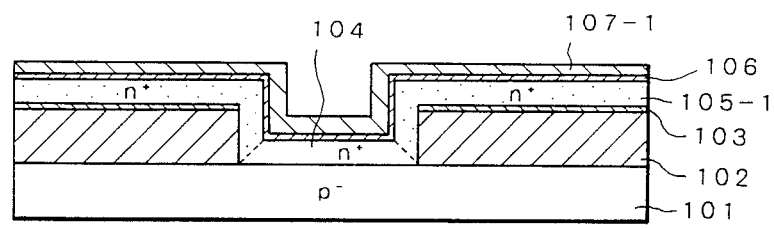
FIG_3(c)
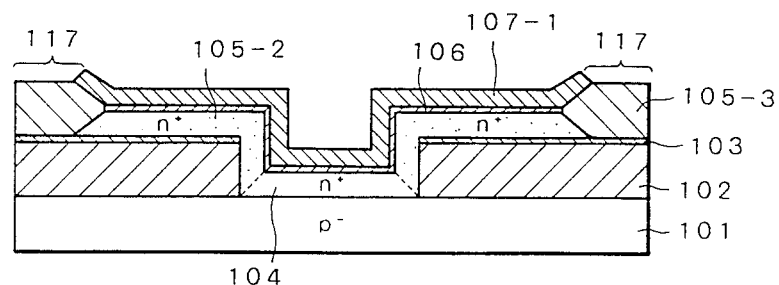

FIG_3(j)
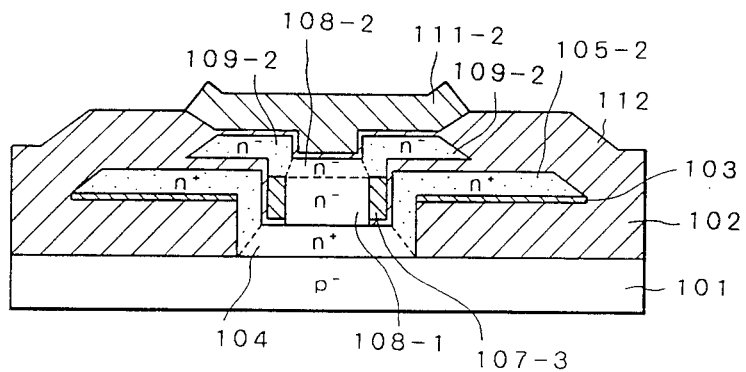
FIG_3(k)
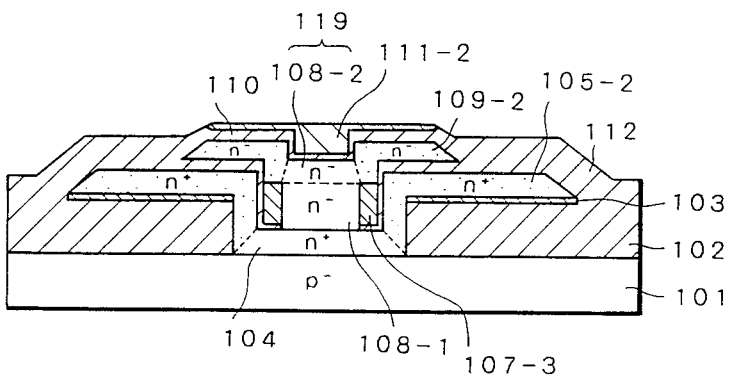
FIG_3(l)
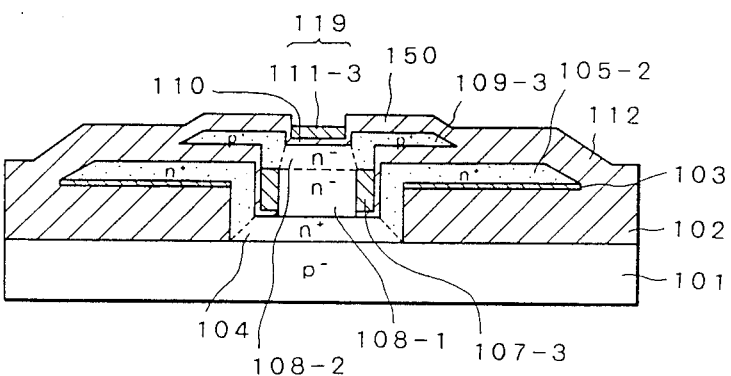

FIG_3(m)
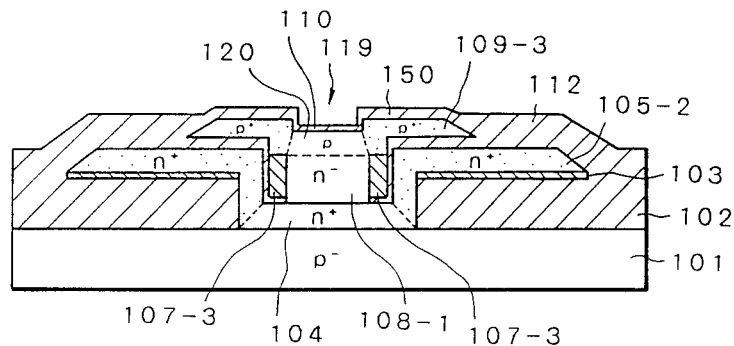
FIG_3(n)
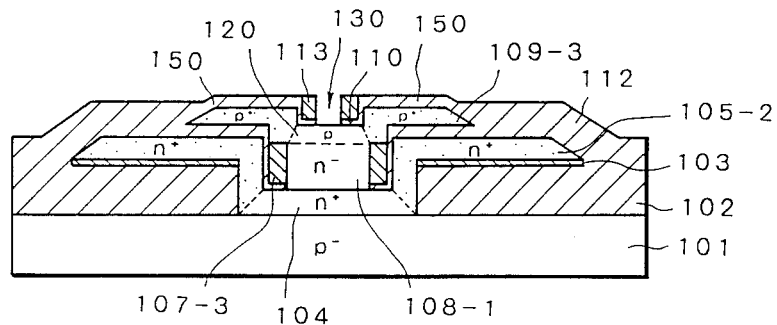
FIG_3(o)
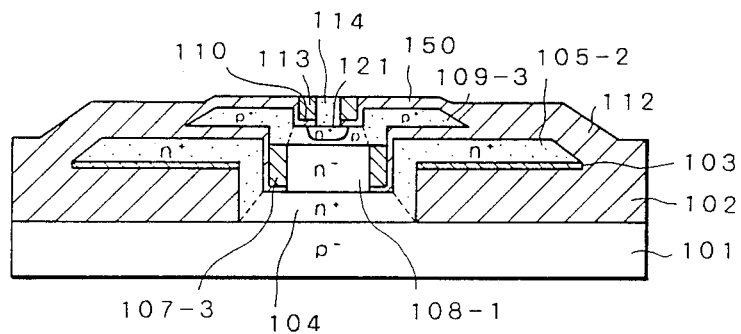

FIG_4 (a)
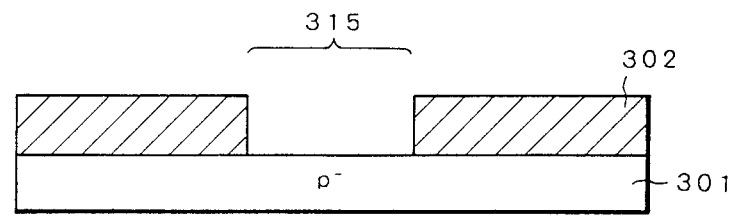
FIG_4 (b)
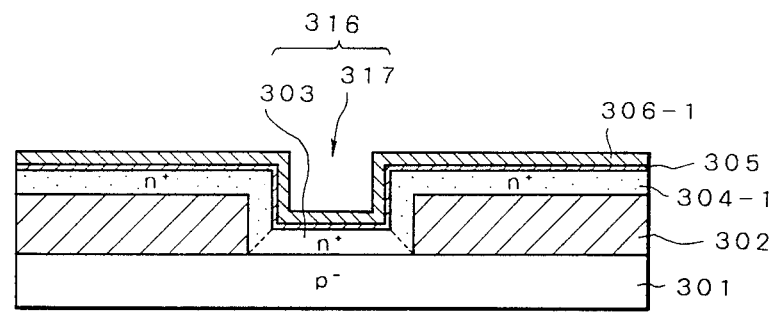
FIG_4 (c)
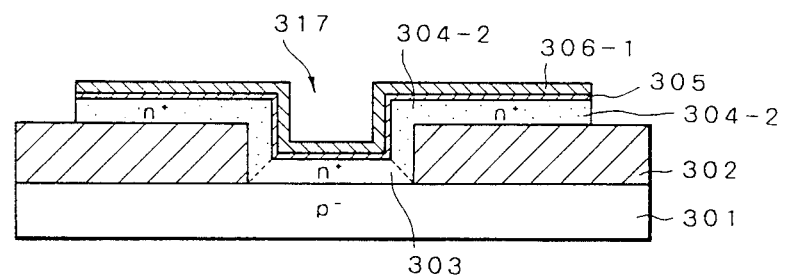

FIG_4 (d)
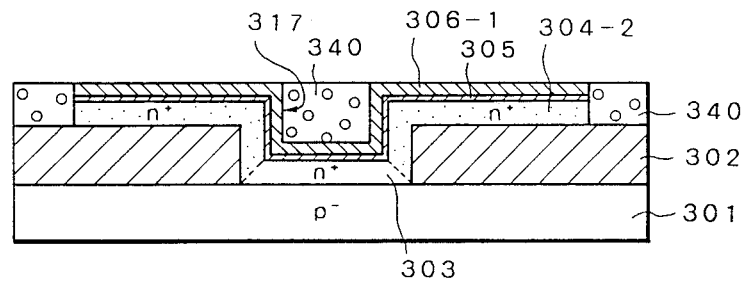
FIG_4 (e)
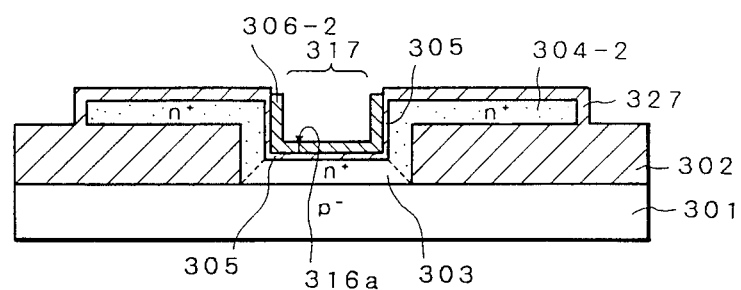
FIG_4 (f)
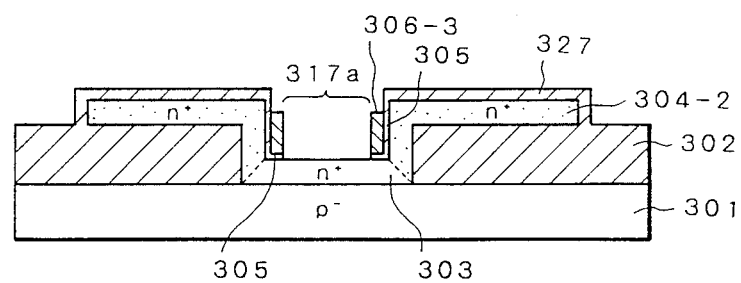

FIG_4(g)
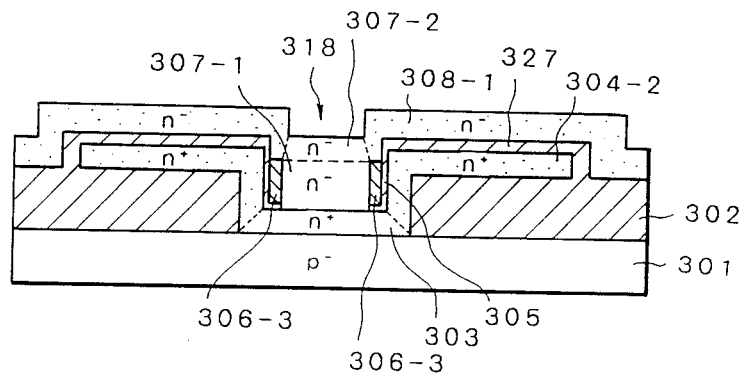
FIG_4(h)
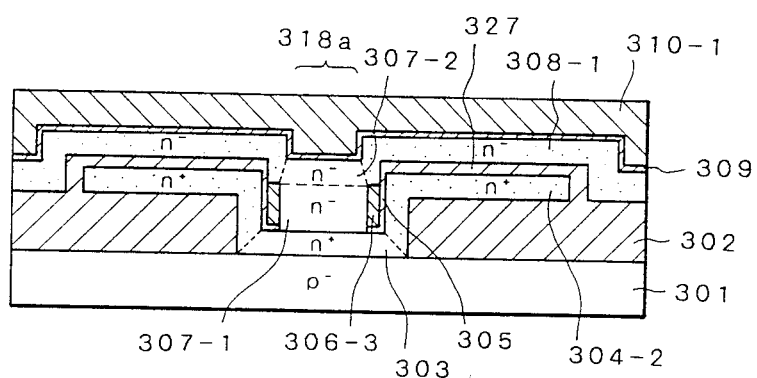

FIG_4 (k)
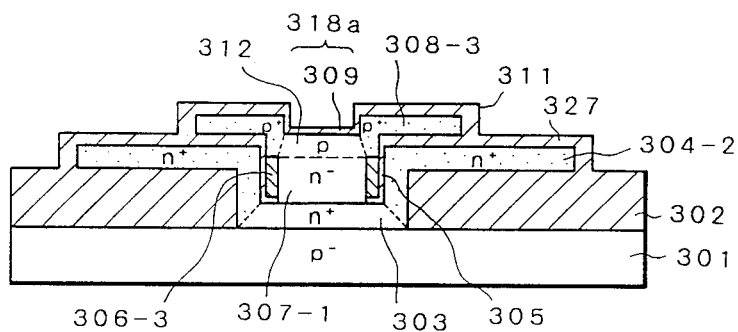
FIG_4 (l)
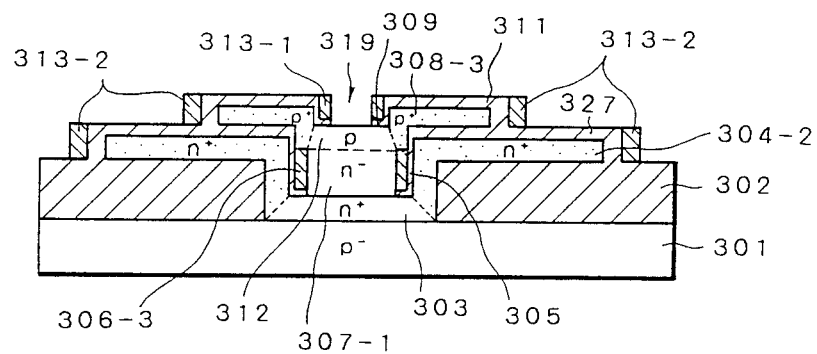

FIG_4 (m)
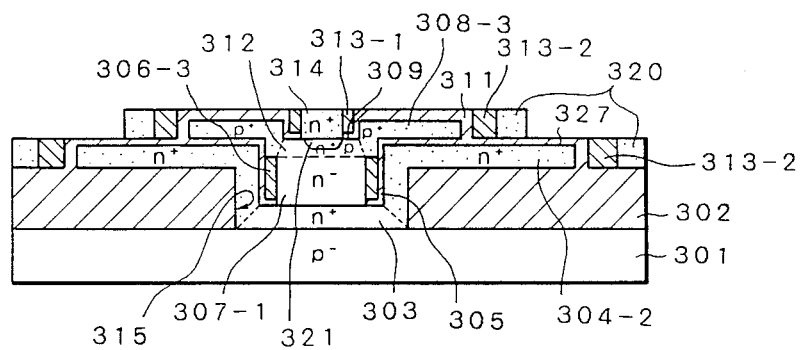

BI-POLAR TRANSISTOR STRUCTURE

BACKGROUND OF THE INVENTION

1. Field of the Invention

The present invention relates to a bi-polar transistor structure constituting an active element in a superhigh speed logic integrated circuit, and a process for producing the same.

2. Prior Art

In general, ECL (emitter coupled logic) circuits are used as superhigh speed logic integrated circuits. The following two requirements in the parameters of transistors incorporated into an ECL circuit may be mentioned, in a rough sense, for improving the operational speed of the ECL circuit. One requirement is to reduce the parasitic capacitance and parasitic resistance of a transistor, which are transistor parameters as circuit constants, while the other requirement is to improve the cut-off frequency $f_T$ of the transistor, which is a major parameter affecting the performance of the transistor. Factors in the transistor that are important to meet the above-mentioned requirements include the base resistance $r_{bb'}$, the collector saturation resistance $r_{CS}$, the base-collector junction capacitance $c_{TC}$, the collector-substrate junction capacitance $c_{TS}$, and the effective base width $W_B$. These factors are all desired to be minimized. Among others, however, the influences of $c_{TC}$ and $W_B$ are large. Since the $c_{TC}$ is a factor that not only adversely affects the parasitic capacitance of a circuit but also holds down the $f_T$, a reduction in the $c_{TC}$ is important in an aspect of the transistor itself as well as in an aspect of the circuit As for the $W_B$, $f_T$ rises in reverse proportion to the square of the $W_B$, which may therefore be highly contributory as compared to the other factors. Thus, the $W_B$ is an important factor as well.

From the above-mentioned point of view, the conventional approaches to an improvement in the above-mentioned operational speed have placed emphasis on the base region of a transistor in most cases. Specifically, those approaches include provision of a shallow junction between an active base layer and a collector layer (reduction in effective base width $W_B$) and a reduction in an outer base region (decrease in base-collector junction capacitance $c_{TC}$), on the two of which great emphasis has been placed.

Since the reduction in the size of a transistor resulting from the above-mentioned approaches concurrently contributes to an improvement in the scale of integration of an integrated circuit, however, an integrated circuit is inevitably scaled up in the integration thereof to incur an increase in the power consumption thereof Such an increase in power consumption of an integrated circuit brings about various problems, including a decrease in the reliability of transistors incorporated into the integrated circuit because of an increase in the electric current density through wirings in the circuit, and changes in the characteristics of the circuit because of heat build-up therein. Therefore, the performance of a transistor must be such that a high operational speed can be secured with a low operational electric current. When the above-mentioned transistor parameters are examined from this point of view, it will be apparent that a reduction in the collector substrate junction capacitance $c_{TS}$ is important in addition to reductions in the base-collector junction capacitance $c_{TC}$ and the effective base width $W_B$.

A description will be made of a technique developed from this point of view which is disclosed in Japanese Patent Publication No. 54,255/1986. FIGS. 1(a) to 1(h) are cross-sectional views of major structures in the steps of production of a bi-polar transistor structure according to the process disclosed in this patent literature as one example of conventional processes.

First, as shown in FIG. 1(a), an oxide layer 202 formed on the whole surface of a substrate 201 is subjected to patterning to expose a surface area of the substrate 201 having thereon a hole 201a to constitute a single crystal region wherein a transistor is to be formed.

Subsequently, as shown in FIG. 1(b), an n-type impurity or dopant is diffused into the substrate 201 from the above-mentioned exposed surface area thereof to form an embedded collector layer 203. Meanwhile, a p+-type region 204 is a p+-type channel cut region provided in a surface portion of the p-type substrate 201 and in a region thereof other than the n+-type embedded region.

Thereafter, as shown in FIG. 1(c), n-type epitaxial growth is effected to form a single crystal layer 205a on the exposed surface area of the substrate 201 having thereon the hole 201a to constitute the single crystal region and a polycrystalline layer 205b on the oxide layer 202.

Subsequently, as shown in FIG. 1(d) a p-type impurity or dopant is diffused through the whole upper surface under predetermined conditions to form p-type regions 251a and 251b differing thickness because of a difference in the diffusion coefficient of the impurity or dopant between the single crystal layer 205a and the polycrystalline layer 205b.

Thereafter, as shown in FIG. 1(e), etching back is effected by dry etching using a mixed gas of $CF_4+O_2$ to substantially planarize the whole upper surface by virtue of the dependency of etching on impurity or dopant concentration.

The succeeding steps, for the details of which reference may as well be made to the aforementioned patent literature, are simply illustrated in FIGS. 1(f) and 1(g) 1(h) showing an active base layer 207a, an outer base region 207b, a base electrode 211c, a collector sink region 209a, a collector electrode 209b, and an emitter layer 210, which are formed using known photoetching and impurity or dopant diffusion techniques. In FIG. 1(h) numerals 211a and 211b refer to another collector electrode and an emitter electrode, respectively.

The foregoing conventional process has a feature that the use of the microphtoetching technique enables both of the base-collector junction capacitance $c_{TC}$ and the collector-substrate junction capacitance $c_{TS}$ of the resulting bi-polar transistor to be lowered with the value of $c_{TS}$ being extremely low as compared with that of an isoplanar transistor produced at the same level of fineness as in the case of the above-mentioned process.

Since patterning of the emitter region and the base region is effected by the photoetching technique in the above-mentioned conventional process for producing the bi-polar transistor, however, the fineness of the resulting circuit is restricted by minimum resolution and minimum registration accuracy inherent in the photoetching technique.

Therefore, there arises a problem that, compared with an isoplanar transistor produced at the same level of fineness as in the case of the above-mentioned process, reductions in the base resistance $r_{bb}'$ and the base-collector junction capacitance $c_{TC}$ of the bi-polar transistor are impossible through a reduction in the collector-substrate junction capacitance $c_{TS}$ of the bi-polar transistor is possible.

Further, since the base and collector electrodes are provided only on one side of the active layer according to the above-mentioned conventional process, reductions in the collector saturation resistance $r_{CS}$ and the base resistance $r_{bb}'$, which are the series resistance components of the base and the collector, respectively, are restricted.

In addition to the above-mentioned problems, the surface of the polycrystalline silicon base electrode and the surface of the polycrystalline silicon collector electrode are covered uniformly with silicon oxide films to require a so-called "contact step" (step of forming contact holes) of perforating the silicon oxide films by a photoetching technique to connect the electrodes to a wiring pattern in the course of formation of an integrated circuit. This will make the dimensional accuracy and the registration accuracy in the contact step restrictive factors in improving the overall operational speed of the integrated circuit by raising the scale of integration of the circuit to minimize the retardation of the circuit operation attributed to wirings.

SUMMARY OF THE INVENTION

An object of the present invention is to provide a process for producing a bi-polar transistor structure which can eliminate a restriction on fining down an integrated circuit, namely reducing the parasitic parameters thereof, because of a limited competence of the aforementioned photoetching technique to concurrently reduce the collector saturation resistance $r_{CS}$, the base resistance $r_{bb}'$, the base-collector junction capacitance $c_{TC}$ and the collector-substrate junction capacitance $c_{TS}$ as the parasitic parameters to thereby improve the operational speed of a transistor, and which can obviate not only the problem of the aforementioned accuracies, in the contact step of the prior art process, leading to a restriction on raising the scale of integration of the integrated circuit (i.e., increasing the operational speed), but also the problem of the intense heat treatment of the prior art process, resulting in a decrease in the DC characteristics of the transistor.

Another object of the present invention is to provide a bi-polar transistor structure which is low in the collector saturation resistance $r_{CS}$, the base resistance $r_{bb}'$, base-collector junction capacitance $c_{TC}$ and the collector-substrate junction capacitance $c_{TS}$ as the parasitic parameters thereof, and which is not only improved in the DC characteristics and operational speed thereof as a transistor unit, but also contributory to an improvement in the operational speed of an integrated circuit.

The first process for producing a bi-polar transistor structure according to the present invention comprises the steps of forming an oxide layer on the whole surface of a silicon substrate; selectively removing a region of the oxide layer wherein a transistor is to be formed (transistor region); effecting epitaxial growth on the whole surface to simultaneously form an embedded single crystal collector layer in the transistor region and a polycrystalline layer for a collector electrode on the remaining oxide layer; selectively oxidizing the polycrystalline layer for the collector electrode by a known selective oxidation technique using an oxidation-resistant layer to form an oxide layer(s) to thereby define the remaining polycrystalline layer as the collector electrode; removing the oxide layer(s); partially removing the oxidation-resistant layer used in the selective oxidation step in such a way as to leave part of the oxidation-resistant layer as an insulating layer only on the side wall of a recess corresponding to the transistor region while exposing the surface of the embedded single crystal collector layer; effecting selective epitaxial growth to form a low impurity concentration single crystal collector layer only on the exposed surface of the embedded single crystal collector layer; effecting customary epitaxial growth to simultaneously form a low impurity concentration single crystal layer on the low impurity concentration single crystal collector layer and polycrystalline layer for a base electrode on the polycrystalline collector electrode layer with an insulating layer therebetween formed before; selectively oxidizing the polycrystalline layer for the base electrode to thereby define the remaining polycrystalline layer as the base electrode; introducing an impurity or dopant from a recess formed inside the transistor region in the customary epitaxial growth step to convert the low impurity concentration single crystal layer into a layer for an active base layer; forming an insulating layer on the polycrystalline base electrode layer and on the side wall of the recess to narrow the recess while exposing a surface area of the layer for the active base layer corresponding to the bottom of the narrowed recess; filling the narrowed recess with polycrystalline silicon for an emitter electrode; and introducing an impurity or dopant into a surface portion of the layer for the active base layer through the polycrystalline silicon to convert the surface portion of the layer into an emitter layer while leaving intact the other portion of the layer as the active base layer.

The second process for producing a bi-polar transistor structure according to the present invention comprises steps of forming an oxide layer on the whole surface of a silicon substrate; selectively removing a region of the oxide layer wherein a transistor is to be formed (transistor region); effecting epitaxial growth on the whole surface to simultaneously form an embedded single crystal silicon collector layer in the transistor region and a polycrystalline silicon layer for a collector electrode on the remaining oxide layer; patterning the polycrystalline silicon layer for the collector electrode by a known photoetching technique; forming an insulating layer only on the surface of the patterned polycrystalline silicon collector electrode layer including the side wall of a recess corresponding to the transistor region; effecting selective epitaxial growth to form a low impurity concentration single crystal silicon collector layer only on the exposed surface of the embedded single crystal silicon collector layer; effecting customary epitaxial growth to simultaneously form a low impurity concentration single crystal silicon layer on the low impurity concentration single crystal silicon collector layer and a polycrystalline silicon layer for a base electrode on the insulating layer; patterning the polycrystalline silicon layer for the base electrode by a known photoetching technique; introducing an impurity or dopant from a recess formed inside the transistor region in the customary epitaxial growth step to convert the low impurity concentration single crystal silicon layer into a layer for an active base layer; forming an insulating layer only on the polycrystalline silicon base electrode layer and the side wall of the recess to narrow the recess; filling the narrowed recess with polycrystalline silicon for an emitter electrode; and introducing an impurity or dopant into a surface portion of the layer for the active base layer through the polycrystalline silicon to convert the surface portion of the layer into an emitter layer while leaving intact the other portion of the layer as the active base layer.

The bi-polar transistor structure of the present invention comprises a semiconductor substrate; an embedded single crystal collector layer of conductivity type reverse to that of the semiconductor substrate, formed, through epitaxial growth, on the bottom of a hole (transistor region) of an insulating layer formed on the surface of the semiconductor substrate except for a surface area thereof corresponding to the bottom of the hole wherein the transistor is formed; a polycrystalline collector electrode layer formed on the insulating layer including the side wall of the hole through the above-mentioned epitaxial growth; a low impurity concentration single crystal collector layer formed by selective epitaxial growth on the embedded single crystal collector layer with the aid of patterning means applied on the polycrystalline collector electrode layer through selective oxidation; a polycrystalline base electrode layer formed through customary epitaxial growth and selective oxidation; a single crystal active layer of the same conductivity type as that of the substrate, formed on the low impurity concentration single crystal collector layer through the above-mentioned customary epitaxial growth, to form a single crystal layer, and introduction of an impurity or dopant into the single crystal from a recess formed inside the transistor region; a polycrystalline silicon emitter electrode layer embedded in a narrowed recess formed inside the above-mentioned recess and having a side wall constituted of an insulating layer; and a single crystal emitter layer of conductivity type reverse to that of the substrate, having an upper surface consisting the bottom of the narrowed recess and formed by introduction, thorough the polycrystalline silicon emitter electrode layer, of an impurity or dopant into a surface portion of the single crystal layer formed through the above-mentioned customary epitaxial growth and introduction of the impurity or dopant.

In the first process of the present invention, a recess wherein a transistor is to be formed in an insulating layer formed on a substrate, and active layers (single crystals), electrode layers (polycrystalline) and insulating
layers are formed in order of a collector, a base and an emitter by using only thin film forming techniques and etching techniques in such a way as to dispose the active layers, an emitter electrode layer, parts of the other electrode layers and parts of the insulating layers inside the above-mentioned recess. Thus, the first process needs no complicated techniques of registration control and dimensional control as involved in photoetching techniques which have heretofore been widely practiced.

In the second process of the present invention, polycrystalline layers for base and collector electrodes are subjected to patterning by a photoetching technique and side wall insulating layers are formed around the patterned polycrystalline electrode in the respective later steps. Therefore, the utilization of these side wall insulating layers avoids the need to use photoetching techniques in the contact step for wirings, and instead permits contact regions to be formed in self-alignment by blanket anisotropic etching of insulating layers. Further, since this process involves no step of selective oxidation by a heat treatment at a high temperature, a change in the impurity distribution of impurity-diffused layers, which would otherwise be caused by thermal diffusion, hardly occurs until the completion of the process.

The bi-polar transistor of the present invention has a coaxial symmetric structure in plan, wherein base and collector active regions have respective peripheries surrounded in the whole or in significant part by respective electrodes to thereby decrease particularly the series resistance components of a base and a collector. Further, in the bi-polar transistor of the present invention, polycrystalline electrode layers is directly connected with active layers with the polycrystalline electrode layers separated from each other by insulating layers provided therebetween to thereby decrease the junction capacitance without a decrease in the junction voltage resistance, which would otherwise be caused by high impurity concentration junctions.

BRIEF DESCRIPTION OF THE DRAWINGS

The foregoing and other objects and advantages of the present invention will be seen by reference to the description, taken in connection with the accompanying drawings, in which:

FIGS. 1(a) to 1(h) are schematic cross-sectional views of major structures, which are illustrative of conventional process for producing a bi-polar transistor;

FIG. 2(a) is a schematic cross-sectional view of an example of the bi-polar transistor of the present invention;

FIG. 2(b) is a schematic plan view of the example, shown in FIG. 2(a), of the bi-polar transistor of the present invention, which shows an arrangement in plan of an emitter region, a base region and a collector region;

FIGS. 4(a) to 4(m) are schematic cross-sectional views of major structures, which are illustrative of another example of the process for producing a bi-polar transistor according to the present invention.

DETAILED DESCRIPTION OF PREFERRED EMBODIMENTS

Examples according to the present invention will now be described while referring to the accompanying drawings, wherein figures are drawn schematically to such an extent as to simply facilitate the understanding of the present invention. In the figures, hatching to indicate cross sections, and the like are partially omitted.

EXAMPLE 1

Figure 3:
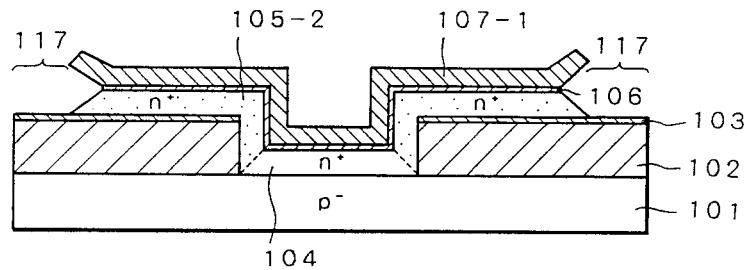
FIGS. 3(a) to 3(o) are schematic cross-sectional views of major structures, which are illustrative of a process for producing the example, shown in FIG. 2(a), of the bi-polar transistor according to the present invention.
Figure 3:
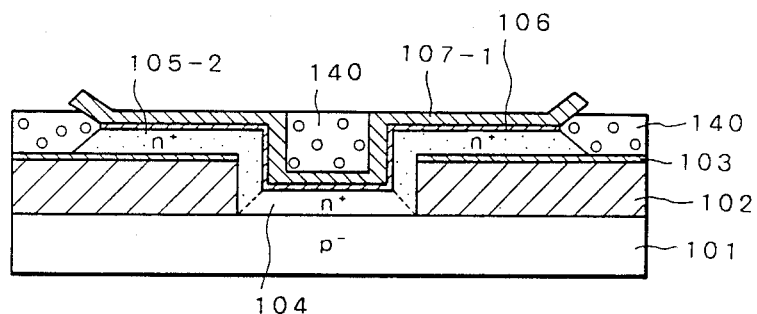
Figure 3:
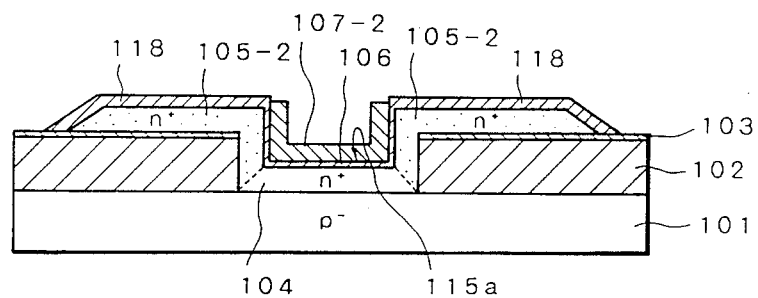

FIG. 2(a) is a cross-sectional view of an example of the bi-polar transistor structure according to the present invention. FIG. 2(b) is a top plan view, seen from above in a direction vertical to the surface of a substrate, of the above-mentioned example of the bi-polar transistor structure, which view is illustrative of the arrangement of an emitter region, a base region and a collector region. The description of this transistor structure will be made while referring to FIGS. 2(a) and 2(b), wherein numerals referring to various portions are the same as those referring to the corresponding portions in FIGS. 3(a) to 3(o) given in connection with the first process according to the present invention as will be described in Example 2 because this transistor structure is produced in accordance with that first process.

A p$^-$-type silicon substrate 101 (hereinafter referred to as a "substrate") is a semiconductor substrate of first conductivity type, on the surface of which a first insulating layer consisting of a thick silicon oxide layer 102 and a silicon nitride layer 103 is formed except for a hole 115 formed through the first insulating layer to reach the surface of the substrate 101. The transistor structure is formed with the hole 115 as the center thereof wherein a transistor is formed.

An n$^+$-type single crystal silicon layer 104 (first single crystal semiconductor layer of second conductivity type as embedded layer for collector) is formed only on the surface area of the substrate 101 corresponding to the hole 115, and has a thickness smaller than ½ of the minimum width of the hole 115. An n$^+$-type polycrystalline silicon layer 105-2 (first polycrystalline semiconductor layer of second conductivity type for collector) having a predetermined defined pattern is formed only on the surface of the first insulating layer 102 and 103 including the side wall of the hole 115 and has a thickness smaller than ½ of the minimum width of the hole 115.

A silicon oxide layer 118 (second insulating layer) is formed only on the surface of the n$^+$-type polycrystalline silicon layer 105-2 including the side wall face of the portion thereof covering the side wall of the hole 115. A side wall silicon nitride layer 107-3 is formed on a side wall portion of the silicon oxide layer 118. A first recess 116 surrounded by the second insulating layer 118 and the first single crystal semiconductor layer 104 is half filled with an n$^-$-type single crystal silicon layer 108-1 (second semiconductor layer of second conductivity type).

A p-type single crystal silicon layer 120 (third single crystal semiconductor layer of first conductivity type as active base layer) as an active base layer is formed only on the surface of the second single crystal semiconductor layer 108-1 consisting the bottom of a second recess 119 formed in an upper portion of the first recess 116 and surrounded by second insulating layer 118 and the second single crystal semiconductor layer 108-1, and has a thickness smaller than ½ of the minimum width of the second recess 119. A p$^+$-type polycrystalline silicon layer 109-3 (second polycrystalline semiconductor layer of first conductivity type as base electrode) having a predetermined defined pattern is formed only on the surface of the second insulating layer 118 including the side wall of the second recess 119, and has thickness smaller than ½ of the minimum width of the second recess 119.

An oxide layer 110 (third insulating layer) is formed only on the surface of the second polycrystalline semiconductor layer 109-2 including the side wall face of a portion thereof covering the side wall of the second recess 119. A third recess 130 surrounded by the third insulating layer 110 and the third single crystal semiconductor layer 120 (active base layer) is completely filled up with a polycrystalline semiconductor layer 114 of second conductivity type (emitter electrode), which is provided only in the third recess 130.

An n$^+$-type emitter region 121 (region of second conductivity type) having a higher charge carrier concentration than the second single crystal semiconductor layer 108-1 is embedded in the single crystal semiconductor layer 120, and has an interface with the third polycrystalline semiconductor layer 114 but no interface with the second polycrystalline semiconductor layer 109-2.

In the foregoing structure, the n$^-$-type single crystal silicon layer 108-1, the n$^+$-type embedded layer 104, the p-type single crystal silicon layer 120, and the n$^+$-type emitter region 121 constitutes together a layered npn-type bi-polar transistor.

More specifically, the n$^-$-type single crystal silicon layer 108-1 is a part of a collector region, which is electrically connected through the n$^+$-type embedded layer 104 as the other part of the collector region with the n$^+$-type polycrystalline silicon layer 105-2 as the collector electrode. The p-type single crystal silicon layer 120 is the active base layer, which is electrically connected directly with the p$^+$-type polycrystalline silicon layer 109-2 as the base electrode. The n$^+$-type single crystal silicon layer 121 is the emitter region, which is electrically connected directly with the n-type polycrystalline silicon layer 114 as the emitter electrode which leads to the outside of the transistor structure.

By way of example, FIG. 2(b) shows a schematic arrangement of the emitter region 121, the base region 120 and the collector region (108-1, 104) when the above-mentioned bi-polar transistor structure according to the present invention is seen from above in a direction vertical to the surface of the substrate. In this instance, the patterns in plan (patterns projected on the surface of the substrate) of the emitter region 121, the base region 120 and the collector region (180-1, 104) are all substantially quadrate (i.e., square) with the sizes thereof in plan (areas thereof projected on the surface of the substrate) increasing in this order. Further, these regions are in superpositional relation with a common axis in the center thereof. Therefore, when these regions are seen in a projection drawing showing them as projected on the surface of the substrate, the positional relationship of these regions are such that part of the base region 120 can be seen with a substantially constant width around the emitter region 121 while part of the collector region (108-1, 104) can be seen with a substantially constant width around the base region 120.

Additionally stated, the patterns in plan of the emitter region 121, the base region 120 and the collector region (108-1, 104) can be chosen to be not only quadrate but also circular, elliptic, rectangular, or of any other arbitrary suitable pattern according to the designing of a desired transistor.

The patterns of the emitter electrode 114, the base electrode 109-2 and the collector electrode 105-2 as well as the directions of electric connection between them and the corresponding emitter, base and collector regions 121, 120 and (108-1, 104), respectively, can be arbitrarily and suitably chosen according to the designing of a desired transistor. In such designing, it is preferable that the emitter electrode 114 be provided in such a way as to be in electrical contact with the upper surface of the emitter region 121. It also is preferable that the base electrode 109-2 be provided in such a way as to be in electrical contact with the base region 120 in the whole or in part of the layer thickness thereof as well as in the whole perimeter thereof or in a perimeric part(s) constituting at least ¼ of the whole perimeter thereof. It also is preferable that the collector electrode 105-2 be provided in such a way as to be in electrical contact with the collector region (108-1, 104) in the whole or in part of the layer thickness thereof as well as in the whole perimeter thereof or on a perimeric part(s) constituting at least ¼ of the whole perimeter thereof.

EXAMPLE 2

FIGS. 3(a) to 3(o) illustrate an example of the first process according to the present invention, by which a bi-polar transistor structure of Example 1 as shown in FIGS. 2(a) and 2(b) is produced. The figures are schematic cross-sectional views of major structures through which the transistor structure is produced. The steps of the process will be described along with those structures in order of the sequential steps of the process.

First, after formation by a known technique of a p+-type channel stopper region (not shown in the figure) on a p−-type silicon substrate 101 (semiconductor substrate of first conductivity type), a silicon oxide layer 102 of 0.5 to 1.0 μm in thickness is formed on the surface of the substrate 101, followed by formation thereon of a silicon nitride layer 103 of 500 to 1,000 Å in thickness. A region of the oxide and nitride layers 102 and 103 wherein a transistor is to be formed (transistor region) is etched by a photoetching technique to form a hole 115 exposing the corresponding surface area of the substrate 101. Thus, a structure as shown in FIG. 3(a) is obtained.

Epitaxial growth of an n+-type silicon layer is effected to form an n+-type single crystal silicon layer 104 as an embedded collector layer on the exposed surface area of the substrate 101 as well as an n+-type polycrystalline silicon layer 105-1, from which a collector electrode is to be formed, on the silicon oxide and silicon nitride layers 102 and 103. Thereafter, a silicon oxide layer 106 of 500 to 1,000 Å in thickness as a buffer layer and a silicon nitride layer 107-1 of 1,000 to 3,000 Å in thickness as an oxidation-resistant layer are sequentially formed to get ready for following selective oxidation step. Thus, a structure as shown in FIG. 3(b) is obtained.

The silicon nitride layer 107-1 is subjected to patterning by a photoetching technique to expose pattern-wise the silicon oxide layer 106 in an area thereof corresponding to a collector electrode separation region 117, and the n+-type polycrystalline silicon layer 105-1 is selectively oxidized with the silicon nitride layer 107-1 as a mask to form an expanded silicon oxide film 105-3 including the corresponding area of the silicon oxide layer 106. Thus, a structure as shown in FIG. 3(c) is obtained.

Subsequently, the expanded silicon oxide film 105-3 is removed to define a polycrystalline silicon region 105-2, from which the collector electrode is to be formed. Thus, a structure as shown in FIG. 3(d) is obtained. In this step, the removal of the expanded silicon oxide film 105-3 can be easily effected using 5 to 10 % buffered hydrofluoric acid since the silicon nitride layers 103 and 107-1 and the polycrystalline silicon layer 105-2 can serve as etching stoppers.

Subsequent application of a photoresist or a polyimide resin (not shown in any figures) is followed by etching back with an $O_2$ plasma to fill up a recess of the transistor region surrounded by the silicon nitride layer 107-1 and the collector electrode separation region 117 with the photoresist 140 or the polyimide resin 140. Thus, a structure as shown in FIG. 3(e) is obtained.

Subsequently, the silicon nitride layer 107-1 is anisotropically etched to leave a silicon nitride layer 107-2 only on the side wall and bottom of a recess 115a surrounded by the remaining silicon oxide layer 106. The photoresist 140 or the polyimide resin 140 is removed. Thereafter, thermal oxidation is effected to oxidize an upper surface portion of the polycrystalline silicon layer 105-2 to thereby form a silicon oxide layer 118 (including the remaining silicon oxide layer 106 except for the region thereof inside the recess 115(a) of 2,000 to 3,000 Å in thickness only on the remaining polycrystalline silicon region 105-2 as the collector electrode. Thus, a structure as shown in FIG. 3(f) is obtained.

Figure 3G:
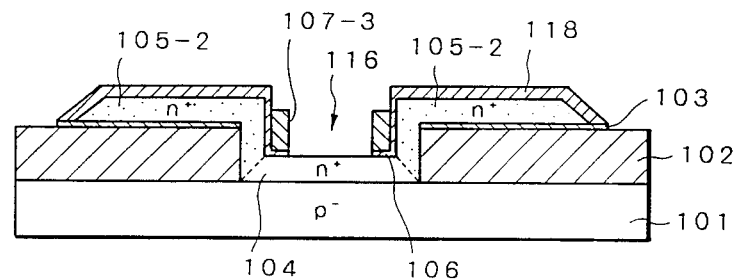

Subsequently, the silicon nitride layer 107-2 is anisotropically etched to form a side wall silicon nitride layer 107-3. Thereafter, part of the silicon oxide layer 118 and the silicon oxide layer 106 remaining inside the recess 115a is anisotropically etched to expose the surface of the n+-type single crystal silicon (embedded collector) layer 104. In this step, a first recess 116 is formed. Thus, a structure as shown in FIG. 3(g) is obtained.

Figure 3H:
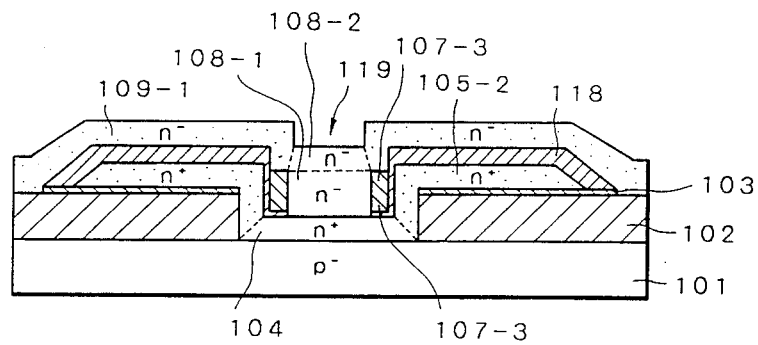

Subsequently, an n−-type single crystal silicon layer 108-1 as a low concentration collector layer is grown only on the exposed surface of the above-mentioned n+-type single crystal silicon (embedded collector) layer 104 by a selective epitaxial growth technique. In this step, the thickness of the grown layer 108-1 is desirably set such that the surface of the grown layer 108-1 is positioned on a level with the top end of the above-mentioned side wall silicon nitride layer 107-3. Thereafter, customary epitaxial growth is effected to simultaneously form an n−-type single crystal silicon layer 108-2 and a polycrystalline silicon layer 109-1, from which a base electrode is to be formed. In this step, a second recess 119 is formed just on the surface of the n−-type single crystal silicon layer 108-2. Thus, a structure as shown in FIG. 3(h) is obtained.

Figure 3I:
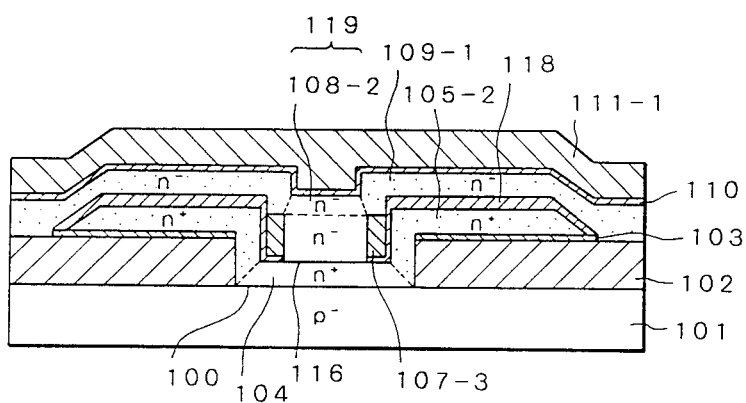

Subsequently, a buffer silicon oxide layer 110 of 500 to 1,000 Å in thickness and a silicon nitride layer 111-1 of 3,000 to 6,000 Å in thickness are sequentially formed to get ready for another selective oxidation. In this step, the thickness of the silicon nitride layer 111-1 is set such that the layer 111-1 can not only fill up therewith a recess, at this stage, corresponding to a second recess 119 of the transistor region but also have a planar surface. Thus, a structure as shown in FIG. 3(i) is obtained.

After subsequent patterning of the above-mentioned silicon nitride layer 111-1, the polycrystalline silicon layer 109-1 is selectively oxidized through the buffer silicon oxide layer 110 to form a silicon oxide layer 112 including the corresponding area of the buffer silicon oxide layer 110 to thereby define a polycrystalline silicon region 109-2, from which the base electrode is to be formed. The resulting structure is as shown in FIG. 3(j).

Subsequently, both of the silicon nitride layer 111-2 and the silicon oxide layer 112 are simultaneously etched back by sputtering etching to planarize the surface. In this step, the amount of the etching back is desirably set such that 20 to 50 % of the original silicon nitride layer 111-2 remains. The resulting structure is as shown in FIG. 3(k).

Subsequently, only the remaining silicon nitride layer 111-2 is etched back by anisotropic etching to leave a silicon nitride layer 111-3 only inside the second recess 119 of the transistor region. Thereafter, a p-type impurity or dopant such as boron (B) is ion-implanted in a dose of $10^{15}$ to $10^{16}$ cm$^{-2}$ into the polycrystalline silicon region 109-2 with an acceleration energy of 20 to 30 keV to convert the polycrystalline silicon region 109-2 into a p+-type polycrystalline silicon region 109-3, from which the base electrode is to be formed. Thereafter, thermal oxidation is effected to oxidize an upper surface portion of the p+-type polycrystalline silicon region or layer 109-3 to form a buffer silicon oxide layer 150 (including the corresponding area of the buffer silicon oxide layer 110) of 2,000 to 3,000 Å in thickness only on the surface of the remaining p+-type polycrystalline silicon region 109-3 as the base electrode. Thus, a structure as shown in FIG. 3(l) is obtained.

Subsequently, the silicon nitride layer 111-3 is removed using hot phosphoric acid or the like. Thereafter, a p-type impurity or dopant such as boron is ion-implanted in a dose of $10^{13}$ to $10^{14}$ cm$^{-2}$ through the buffer silicon oxide layer 110 into the n$^-$-type single crystal silicon layer 108-2 with an acceleration energy of 5 to 10 keV to convert the n$^-$-type single crystal silicon layer into a p-type single crystal silicon layer 120. Thus, a structure as shown in FIG. 3(m) is obtained.

Subsequently, a silicon nitride layer of 1,000 to 3,000 Å in thickness is formed on the buffer silicon oxide layer 150 and the silicon oxide layer 112. Thereafter, this silicon nitride layer is etched back by anisotropic etching to form a side wall silicon nitride layer 113. Thereafter, the bottom area of the buffer silicon oxide layer 110 is etched to form an emitter hole 130 exposing the surface of the p-type single crystal silicon layer 120. The resulting structure is as shown in FIG. 3(n).

Subsequently, a polycrystalline silicon layer of 2,000 to 4,000 Å in thickness is formed on the side wall silicon layer 113, the p-type single crystal silicon layer 120, the silicon oxide layer 150 and the silicon oxide layer 112 in such a way as to fill up the emitter hole 130 with the above-mentioned polycrystalline silicon layer. Thereafter, this polycrystalline silicon layer is etched back by anisotropic etching until the upper end of the above-mentioned side wall silicon nitride layer 113 is exposed. The resulting structure has the emitter hole 130 filled up with a polycrystalline silicon layer 114 [see FIG. 3(o)]. Subsequently, a surface portion of the polycrystalline silicon layer 114 is oxidized down to a depth of about 100 to 200 Å. Subsequent ion implantation of an n-type impurity or dopant such as arsenic (As) in a dose of $10^{16}$ to $10^{17}$ cm$^{-2}$ with an acceleration energy of 40 to 100 keV is followed by a heat treatment in a non-oxidizing atmosphere to convert a surface portion of the p-type single crystal silicon layer 120 into an n+-type emitter region 121 while leaving intact the remaining p-type single crystal silicon layer 129, which is an active base layer. Thus, a transistor having a final impurity or dopant profile structure as shown in FIG. 3(o) is obtained.

The bi-polar transistor produced according to the process of Example 2 has an upper surface structure involving small differences in level, but requires masking when contact holes are to be formed.

EXAMPLE 3

FIGS. 4(a) to 4(m) illustrate an example of the second process for producing a bi-polar transistor structure according to the present invention. The figures are schematic cross-sectional views of major structure through which the transistor structure is produced. The steps of the process will be described along with these structures in order of the sequential steps of the process.

First, after formation by a known technique of a p+-type channel stopper region (not shown in the figures) on a p$^-$-type silicon substrate 301 (semiconductor substrate of first conductivity type), a silicon oxide layer $O_2$ (first insulating layer) of 0.5 to 1.0 μm in thickness is formed on the whole surface of the p$^-$-type substrate 301 (hereinafter referred to as the "substrate"). A region of the above-mentioned oxide layer 302 wherein a transistor is to be formed (transistor region) is etched by a photoetching technique to form a hole 315 exposing the corresponding surface area of the substrate 301. Thus, a structure as shown in FIG. 4(a) is obtained.

A semiconductor of second conductivity type is epitaxially grown on the whole surface to form an n+-type silicon layer consisting of an n+-type single crystal silicon layer 303 (first single crystal semiconductor layer) as an embedded collector layer on the exposed surface area of the substrate 301 and an n+-type polycrystalline silicon layer 304-1 (first polycrystalline semiconductor layer), from which a collector electrode is to be formed, on the silicon oxide layer 302. In this step, a first recess 316 is formed. Thereafter, a silicon oxide layer 305 of 500 to 1,000 Å in thickness as a buffer layer and a silicon nitride layer 306-1 of 1,000 to 3,000 Å in thickness as an oxidation-resistant layer are sequentially formed on the whole surface. In this step, a recess 317 corresponding to the first recess 316 is formed in the silicon nitride layer 306-1. Thus, a structure as shown in FIG. 4(b) is obtained.

Subsequently, the silicon nitride layer 306-1, the silicon oxide layer 305 and the polycrystalline silicon layer 304-2 are subjected to patterning by a photoetching technique to be defined into one and the same pattern. Thus, a structure as shown in FIG. 4(c) is obtained.

Subsequent application of a photoresist or a polyimide resin is followed by etching back through anisotropic etching with an $O_2$ plasma to fill up the recess 317 of the transistor region with the photoresist 340 or the polyimide resin 340. Thus, a structure as shown in FIG. 4(d) is obtained.

Subsequently, the silicon nitride layer 306-1 is anisotropically etched to leave a silicon nitride layer 306-2 only on the wall and bottom of a recess 316a formed by the formation of the above-mentioned buffer silicon oxide layer 305. The photoresist 340 or the polyimide resin 340 is removed. Thereafter, thermal oxidation is effected to oxidize an upper surface portion and a peripheral portion of the polycrystalline silicon layer 304-2 to thereby form a silicon oxide layer 327 (including the once region of the buffer silicon oxide layer 305 other than the recess portion thereof and to be used for formation of a second insulating layer) of 2,000 to 3,000 Å in thickness only on the upper surface and peripheral side wall face of the remaining polycrystalline silicon region 304-2 as the collector electrode. Thus, a structure as shown in FIG. 4(e) is obtained.

Subsequently, the silicon nitride layer 306-2 is anisotropically etched to leave only a side wall silicon nitride layer 306-3. Thereafter, the remaining silicon oxide layer 305 and the silicon oxide layer 327 is anisotropically etched to expose the surface of the n+-type single crystal silicon layer 303 while leaving part of the silicon oxide layer 327 as the second insulating layer 327. In this step, a second recess 317a, which corresponds to the recess 317, is formed. Thus, a structure as shown in FIG. 4(f) is obtained.

Subsequently, an n$^-$-type single crystal silicon layer 307-1 (second single crystal semiconductor layer of second conductivity type) as a low impurity concentration collector layer is grown only on the exposed surface of the above-mentioned n+-type single crystal silicon layer 303 by a selective epitaxial growth technique. In this step, the thickness of the grown layer 307-1 is desirably set such that the surface of the grown layer 307-1 is positioned on a level with the top end of the above-mentioned side wall silicon nitride layer 306-3. Thereafter, customary epitaxial growth is effected to simultaneously form an n⁻-type single crystal silicon layer 307-2 (third single crystal semiconductor layer) and a polycrystalline silicon layer 308-1 (second polycrystalline semiconductor layer), from which a base electrode is to be formed. In this step, a third recess 318 is formed just on the surface of the n⁻-type single crystal silicon layer 307-2. Thus, a structure as shown in FIG. 4(g) is obtained.

Subsequently, a buffer silicon layer 309 of 500 to 1,000 Å in thickness and a silicon nitride layer 310-1 of 3,000 to 6,000 Å in thickness are sequentially formed on the whole surface to obtain a structure as shown in FIG. 4(h). In this step, the thickness of the silicon nitride layer 310-1 is set such that the layer 310-1 can not only fill up a recess 318a surrounded by the buffer silicon oxide 309 formed on the side wall and bottom of the third recess 318 of the transistor region but also have a planar surface.

Figure 4I:
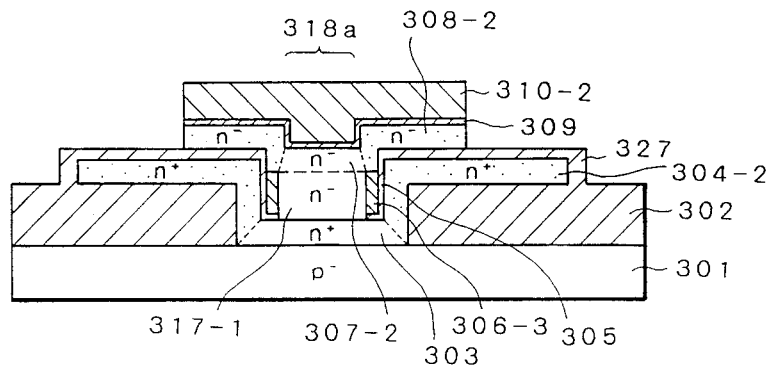

Subsequently, the silicon nitride layer 310-1, the buffer silicon oxide layer 309 and the polycrystalline silicon layer 308-1 is subjected to patterning by a photo-etching technique to be defined into one and same pattern to thereby form a silicon nitride layer 310-2 and a polycrystalline silicon layer 308-2 with the remaining buffer silicon oxide layer 309 therebetween. The resulting structure is as shown in FIG. 4(i).

Figure 4J:
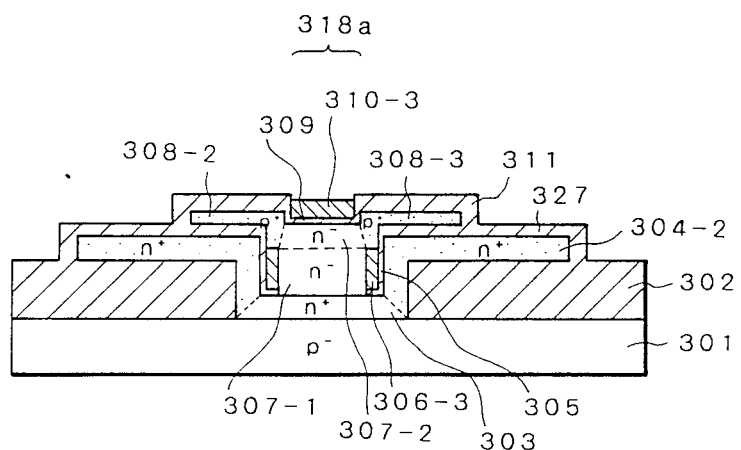

Subsequently, the silicon nitride layer 310-2 is etched back by anistropic etching to leave a silicon nitride layer 310-3 only inside the recess 318a surrounded by the above-mentioned remaining buffer silicon oxide layer 309 formed on the side wall and bottom of the third recess 318 of the transistor region. Thereafter, a p-type impurity or dopant such as boron is ion-implanted in a dose of $10^{15}$ to $10^{16}$ cm$^{-2}$ into the polycrystalline silicon region 308-2 with an acceleration energy of 20 to 30 keV to convert the polycrystalline silicon layer 308-2 into a p⁺-type polycrystalline silicon layer 308-3 of first conductivity type, from which a base electrode is to be formed. Thereafter, thermal oxidation is effected to oxidize an upper surface portion and a peripheral portion of the polycrystalline silicon layer 308-3 to thereby form a buffer silicon oxide layer 311 (third insulating layer, including the once region of the above-mentioned remaining buffer silicon oxide layer 309 other than the recess portion thereof) of 2,000 to 3,000 Å in thickness only on the upper surface and peripheral side wall face of the remaining p⁺-type polycrystalline silicon layer 308-3 as the base electrode. Thus, a structure as shown in FIG. 4(j) is obtained.

Subsequently, the silicon nitride layer 310-3 in the recess 318a is removed using hot phosphoric acid or the like. Thereafter, a p-type impurity or dopant such as boron is ion-implanted in a dose of $10^{13}$ to $10^{14}$ cm$^{-2}$ through the remaining buffer silicon oxide layer 309 with an acceleration energy of 5 to 10 keV to form a p-type single crystal silicon layer 312 of first conductivity type, from which an active base layer is to be formed. Thus, a structure as shown in FIG. 4(k) is obtained.

Subsequently, a silicon nitride layer of 1,000 to 3,000 Å in thickness is formed on the whole surface of the silicon oxide layers 302, 309 and 311. Thereafter, this silicon nitride layer is etched back by anisotropic etching to form a side wall silicon nitride layer 313-1 in the recess 318a as well as side wall silicon nitride layers 313-2 (fourth insulating layers) around the pattern of the polycrystalline silicon layer 304-2 as the collector electrode and around the pattern of the polycrystalline silicon layer 308-2 as the base electrode. Thereafter, the remaining buffer silicon layer 309 is etched to form an emitter hole 319. The resulting structure is as shown in FIG. 4(l).

Subsequently, a polycrystalline silicon layer of 2,000 to 4,000 Å in thickness is formed on the silicon oxide layers 302, 327 and 311, the side wall silicon nitride layers 313-1 and 313-2, and the p-type single crystal silicon layer 312, in such a way as to fill up the emitter hole 319 with the above-mentioned polycrystalline silicon layer. Thereafter, this polycrystalline silicon layer is etched back by anisotropic etching until the upper end of the side wall silicon nitride layer 313-1 is exposed. The resulting structure has the emitter hole 319 filled up with a polycrystalline silicon layer 314 as an emitter electrode, while at the same time having polycrystalline silicon side wall layer 320 surrounding the side wall silicon nitride layers 313-2 around the pattern of the polycrystalline silicon layer 304-2 as the collector electrode and around the pattern of the polycrystalline silicon layer 308-3 as the base electrode. Thereafter, a surface portion of the polycrystalline silicon layer 314 is oxidized down to a depth of about 100 to 200 Å. Subsequent ion implantation of an n-type impurity or dopant such as arsenic in a dose of $10^{16}$ to $10^{17}$ cm$^{-2}$ with an acceleration energy of 40 to 100 keV is followed by a heat treatment in a non-oxidizing atmosphere to convert a surface portion of the p-type single crystal silicon layer 312 into an n⁺-type emitter layer 321 of second conductivity type while leaving intact the remaining p-type single crystal silicon layer 312 of first conductivity type, which is an active base layer. Thus, a transistor having a final impurity or dopant profile structure as shown in FIG. 4(m) is obtained.

The concept of the present invention related to a bi-polar transistor structure and a process for producing the same is applicable not only to npn-type bi-polar transistor structures as demonstrated in the foregoing Examples, but also to pnp-type transistor structures. Further, the compositions including the impurity or dopant concentration, layer thickness, sizes, etc, of the various constituent portions of an element or transistor structure should not be construed as being limited to those mentioned in the foregoing Examples.

The bi-polar transistor structure produced according to the process of Example 3 has an upper surface involving a large difference in level, but permits contact holes to be easily formed by a treatment with buffered hydrofluoric acid.

As described above in detail, since the bi-polar transistor structure of the present invention has a substantially coaxial structure in plan wherein base and collector electrodes are provided along at least parts of the peripheries of base and collector active regions, respectively, with respective electrical contacts therebetween made all along the above-mentioned respective peripheries or in respective parts thereof having a total length of at least ¼ of the respective perimeters of those regions, the series resistance components of a base and a collector can be remarkably reduced to improve the operational speed of the transistor throughout the whole operational electric current sphere thereof by at least tenfold as against the operational speeds of conventional bi-polar transistors.

Further, since the bi-polar transistor structure of the present invention does not have so-called "peripheral regions" doped with an impurity or dopant in a high concentration, but has the polycrystalline layer electrode directly connected with the active layers and mutually isolated with insulating layers provided therebetween, there arise no problems of deterioration of the voltage resistance of junctions and increases in the capacitances of the junctions, which would otherwise be caused if the junctions were those having respective high impurity or dopant concentrations. This enables the production of finer transistor structures.

According to the first process of the present invention, an oxide layer formed on a substrate is etched in such a way as to form a hole in a region thereof wherein a transistor is to be formed (transistor region), and active layers, electrode layers and insulating layers are sequentially formed in order of a collector, a base and an emitter with effective utilization of the side wall of the above-mentioned hole as the center of a transistor structure by using only thin-film forming techniques and etching techniques. This eliminates the necessities of registration control and dimensional control involved in photoetching techniques to enable the production, with a very good reproducibility, of transistor structures so fine as to be beyond such restrictions on registration accuracy and minimum resolution as will accompany the photoetching techniques.

Further, according to the first process of the present invention, since patterning of polycrystalline layers for the formation of electrodes is done using a selective oxidation technique, the surface of the transistor region is so planar as to be effective in simultaneously achieving high fineness, high reliability and low resistance of wirings.

According to the second process of the present invention, since patterning of polycrystalline silicon layers for the formation of base and collector electrodes is done using a photoetching technique and side wall insulating layers are formed around the resulting patterns of the polycrystalline silicon electrode in the succeeding steps, no photoetching technique is necessary in the contact step and contact regions can be formed in self-alignment fashion by blanket anisotropic etching of insulating layers. Accordingly, it is possible to improve the scale of integration of a circuit to thereby improve the operational speed thereof. Further, since this process involves no selective oxidation steps, a change in the impurity or dopant profile due to thermal diffusion is so low as to enable the production, with a good reproducibility, of transistors having good high-frequency characteristics and good DC characteristics.

What is claimed is:

1. A bi-polar transistor structure comprising a bi-polar transistor formed on one major surface of a semiconductor substrate of first conductivity type, which comprises:

a first insulating layer (102, 103; 302) provided on said major surface of a semiconductor substrate (104; 303) of first conductivity and having a hole (115; 315) of sufficient depth to reach said major surface of said semiconductor substrate (101; 301) of first conductivity type;

a first single crystal semiconductor layer (104; 303) of second conductivity type provided only on a surface area of said semiconductor substrate (101; 301) constituting the bottom of said hole (115; 315) and having a thickness smaller than ½ of the minimum width of said hole (115; 315);

a first polycrystalline semiconductor layer (105-2; 304-2) of second conductivity type provided only on the surface of said first insulating layer (102, 103; 302) including the side wall of said hole (115; 315), and having a predetermined defined pattern and a thickness smaller than ½ of the minimum width of said hole (115; 315);

a second insulating layer (106, 107-3, 118; 305, 306-3, 327) provided only on the surface of said first polycrystalline semiconductor layer (105-2; 304-2) including the face of the side wall portion thereof covering the side wall of said hole (115; 315);

a second single crystal semiconductor layer (108-1; 307-1) of second conductivity type provided in such a way as to half fill therewith a first recess (116; 317) formed inside said hole (115; 315) and surrounded by said second insulating layer (106, 107-3, 118; 305,306-3, 327) and said first single crystal semiconductor layer (104; 303);

a third single crystal semiconductor layer (120; 312) of first conductivity type provided on the surface of said second single crystal semiconductor layer (108-1; 307-1) constituting the bottom of a second recess (119; 318a) formed on the upper side of said first recess (116; 317) and surrounded by said second insulating layer (106, 107-3, 118; 305, 306-3, 327) and said second single crystal semiconductor layer (108-1; 307-1), and having a maximum thickness smaller than ½ of the minimum width of said second recess (119; 318a);

a second polycrystalline semiconductor layer (109-3; 308-3) of first conductivity type provided only on above said second insulating layer (106, 107-3, 118; 305, 306-3,327) including the face of the side wall portion thereof constituting the side wall of said second recess (119; 318a), and having a predetermined defined pattern and a thickness smaller than ½ of the minimum width of said second recess (119; 318a);

a third insulating layer (110, 110a, 113; 309, 311, 313-1) provided on the surface of said second polycrystalline semiconductor layer (109-3; 308-3) including the face of the side wall portion thereof covering the side wall of said second recess (119; 318a);

a third polycrystalline semiconductor layer (114; 314) of second conductivity type provided only inside a third recess (130; 319) formed inside said second recess (119; 318a) and surrounded by said third insulating layer (110, 110a, 113; 309, 311, 313-1) and said third single crystal semiconductor layer (120; 312) in such a way as to completely fill up said third recess (130; 319) with said third polycrystalline semiconductor layer (114; 314); and a region (121; 321) of second conductivity type embedded in said third single crystal semiconductor layer (120; 312) and having an impurity or dopant concentration higher than that of said third single crystal semiconductor layer (120; 312);

wherein said region (121; 312) of second conductivity type has an interface with said third polycrystalline semiconductor layer (114; 314) but no interface with said second polycrystalline semiconductor layer (109-3; 308-3);

wherein said third single crystal semiconductor layer (120; 321) is a region (120; 312) of first conductivity type adjoining said region (121; 321) of second conductivity type and having an interface with said second polycrystalline semiconductor layer (109-3; 308-3) but no interface with said first single crystal semiconductor layer (104; 303); and wherein said first single crystal semiconductor layer (104; 303) is electrically connected with said first polycrystalline semiconductor layer (105; 304-2), while said third single crystal semiconductor layer (120; 312) is electrically connected with said second polycrystalline semiconductor layer (109-3; 308-3).

2. A bi-polar transistor single structure as claimed in claim 1, wherein said first single crystal semiconductor layer (104; 303) and said second single crystal semiconductor layer (108-1; 307-1) constitute a collector region; said third single crystal semiconductor layer (120; 312) constitutes a base region; and said region (121; 321) of second conductivity type constitutes an emitter region.

3. A bi-polar transistor structure as claimed in claim 1 wherein said semiconductor substrate (101; 301) of first conductivity type is $p^-$-type silicon substrate; said first single crystal semiconductor layer (104, 303) of second conductivity type is an $n^+$-type single crystal silicon layer; said second single crystal semiconductor layer (108-1; 307-1) of second conductivity type is an $n^-$-type single crystal silicon layer; said third single crystal semiconductor layer (120; 312) of first conductivity type is a p-type single crystal silicon layer; said region (121; 321) of second conductivity type is an $n^+$-type single crystal silicon layer; said first polycrystalline semiconductor layer (105-2; 304-2) of second conductivity type is an $n^+$-type polycrystalline silicon layer; said second polycrystalline semiconductor layer (109-2; 308-3) of first conductivity type is a $p^+$-type polycrystalline silicon layer; and said third polycrystalline semiconductor layer (114; 314) of second conductivity type is an $n^-$-type polycrystalline silicon layer.

4. A bi-polar transistor structure as claimed in claim 1, wherein said first insulating layer (102, 103; 302) is a silicon oxide layer or a combination of a silicon oxide layer and a silicon nitride layer; and said second insulating layer (106, 107-3, 118; 305, 306-3, 327) and said third insulating layer (110, 110a, 113; 309, 311, 313-1) are each a combination of a silicon oxide layer and a silicon nitride layer.

5. A bi-polar transistor structure according to claim 23 wherein said semiconductor substrate (101; 301) of first conductivity type comprises a $p^-$ type silicon substrate; said first single crystal semiconductor layer (104; 303) of second conductivity type comprises an $n^+$ type single crystal silicon layer; said second single crystal semiconductor layer (108-1; 307-1) of second conductivity type comprises an $n^-$ type single crystal silicon layer; said third single crystal semiconductor layer (120; 312) of first conductivity type comprises a p type single crystal silicon layer; said region (121; 321) of second conductivity type comprises an $n^+$ type single crystal silicon layer; said first polycrystalline semiconductor layer (105-2; 304-2) of second conductivity type comprises an $n^{30}$ type polycrystalline silicon layer; said second polycrystalline semiconductor layer (109-2; 308-3) of first conductivity type comprises a $p^+$ type polycrystalline silicon layer; and said third polycrystalline semiconductor layer (114; 314) of second conductivity type comprises an $n^+$ type polycrystalline silicon layer.

6. A bi-polar integrated circuit transistor structure comprising:

a centrally located first single crystal semiconductor region (104; 303) and a first polysilicon layer (105-2; 304-2) connected thereto, both located above or upon a substrate (101; 301) of a first conductivity type and both having a second conductivity type, a centrally located second single crystal semiconductor region (108-1; 307-1) of the second conductivity type located upon an upper surface of said first single crystal semiconductor region;

a centrally located third single crystal semiconductor region (120; 312) and a second polysilicon layer (109-3; 308-3) connected thereto, both having the first conductivity type, the third single crystal region being located upon an upper surface of said second single crystal semiconductor layer;

a region of second conductivity type semiconductor material (121; 321) centrally located in an upper portion of said third single crystal region;

a third polysilicon layer (114; 314) centrally located upon an upper surface of said region of second conductivity type semiconductor material;

said first polysilicon layer having a portion extending laterally parallel to the substrate and a depending portion connected to said first single crystal region, said depending portion being separated from said second single crystal region;

said second polysilicon layer having a portion extending laterally parallel to the substrate and a depending portion connected to said third single crystal region, said depending portion being separated from said third polysilicon layer;

said second polysilicon layer portion parallel to the substrate being located above and insulated from said first polysilicon layer portion parallel to the substrate;

said third polysilicon layer being insulated from said first and second polysilicon layers.

7. The transistor structure of claim 6 wherein said first polysilicon layer portion that is parallel to the substrate is separated therefrom by dielectric.

8. The transistor structure of claim 6 further comprising dielectric located: between said first polysilicon layer and said substrate, between said first polysilicon layer and said second single crystal semiconductor region, between said first and second polysilicon layers, and between said second and third polysilicon layers.

9. The transistor structure of claim 6 wherein said substrate, said second polysilicon layer, and said third single crystal region all have p type doping.

10. The transistor structure of claim 9 wherein said substrate is doped $p^{31}$ and said second polysilicon is doped $p^+$.

11. The transistor structure of claim 10 wherein said first and third polysilicon layers and said first single crystal region are doped $n^+$.

12. The transistor structure of claim 11 wherein said second single crystal region is doped $n^-$.

* * * * *